US009911535B2

(12) United States Patent
Mori et al.

(10) Patent No.: US 9,911,535 B2
(45) Date of Patent: Mar. 6, 2018

(54) ELECTRONIC DEVICE

(71) Applicant: TDK CORPORATION, Minato-ku, Tokyo (JP)

(72) Inventors: Masahiro Mori, Tokyo (JP); Takayuki Sakai, Tsuruoka (JP); Katsumi Kobayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/059,047

(22) Filed: Mar. 2, 2016

(65) Prior Publication Data

US 2016/0260546 A1    Sep. 8, 2016

(30) Foreign Application Priority Data

Mar. 3, 2015  (JP) ................. 2015-041716

(51) Int. Cl.
| H01G 4/228 | (2006.01) |
| H01G 4/12 | (2006.01) |
| H01G 4/30 | (2006.01) |
| H01G 2/06 | (2006.01) |
| H01G 4/232 | (2006.01) |

(Continued)

(52) U.S. Cl.
CPC ............... *H01G 4/228* (2013.01); *H01G 2/06* (2013.01); *H01G 4/12* (2013.01); *H01G 4/232* (2013.01); *H01G 4/30* (2013.01); *H05K 3/3426* (2013.01); *H05K 3/301* (2013.01); *H05K 2201/1031* (2013.01); *H05K 2201/10946* (2013.01); *H05K 2201/10962* (2013.01); *Y02P 70/611* (2015.11); *Y02P 70/613* (2015.11)

(58) Field of Classification Search
CPC ............ H01G 4/30; H01G 4/12; H01G 4/005; H01G 4/008; H01G 4/228; H01G 4/1227; H01G 4/248

See application file for complete search history.

(56) References Cited

U.S. PATENT DOCUMENTS

| 8,797,712 B2 * | 8/2014 | Otsuka ................ H01G 2/06 361/306.3 |
| 2004/0183147 A1 * | 9/2004 | Togashi ............... H01G 2/065 257/414 |

(Continued)

FOREIGN PATENT DOCUMENTS

| JP | 2008-130954 A | 6/2008 |
| JP | 2012033650 A * | 2/2012 ............... H01G 4/12 |

*Primary Examiner* — Nguyen Ha

(74) *Attorney, Agent, or Firm* — Arent Fox LLP

(57) ABSTRACT

An electronic device includes a chip component and an external terminal. The external terminal includes a terminal electrode connection part, a mounting connection part, and a support part. The terminal electrode connection part is arranged to face an end surface electrode part of a terminal electrode of the chip component. The mounting connection part is connectable to a mounting surface. The support part faces one side surface of an element body of the chip component closest to the mounting surface so as to support the one side surface spaced from the mounting surface. A bonding region and a non-bonding region are formed between the terminal electrode connection part of the external terminal and the end surface electrode part of the terminal electrode. The non-bonding region is formed from the terminal electrode connection part to the support part.

17 Claims, 18 Drawing Sheets

(51) Int. Cl.
 *H05K 3/34* (2006.01)
 *H05K 3/30* (2006.01)

(56) References Cited

U.S. PATENT DOCUMENTS

| | | | | |
|---|---|---|---|---|
| 2009/0296311 | A1* | 12/2009 | Otsuka | H01G 2/065 |
| | | | | 361/306.3 |
| 2012/0236462 | A1* | 9/2012 | Haruki | H01G 4/005 |
| | | | | 361/306.1 |
| 2014/0063687 | A1* | 3/2014 | Saito | H01G 4/228 |
| | | | | 361/308.1 |
| 2015/0054388 | A1* | 2/2015 | Itagaki | H01C 7/008 |
| | | | | 310/364 |

* cited by examiner

ELECTRONIC DEVICE

CROSS-REFERENCE TO RELATED APPLICATION

This application claims the priority of Japanese Patent Application No. 2015-041716, filed Mar. 3, 2015. The disclosure of the priority application is incorporated in its entirety herein by reference.

BACKGROUND OF THE INVENTION

1. Field of the Invention

The present invention relates to an electronic device connected with an external terminal of a metal terminal, for example.

2. Description of the Related Art

In addition to an ordinary chip component in itself directly surface mounted on a substrate or so, an electronic device having a chip component with an external terminal of a metal terminal etc. is proposed as an electronic device such as a ceramic capacitor. The electronic device attached with the external terminal is reported as having effect of reducing deformation stress of the chip component received from the substrate and protecting the chip component from impact etc. after being mounted, and is used in a field where durability and reliability etc. are required.

In the electronic device with the external terminal, one end of the external terminal is connected to a terminal electrode of the chip component, and the other end is connected to a mounting surface of a circuit board or so by solder etc. In recent years, there is a problem that a phenomenon of acoustic noise occurs while the electronic device with the external terminal is mounted on the circuit board.

Patent Document 1: JP Patent Application Laid Open No. 2008-130954

SUMMARY OF THE INVENTION

The present invention has been achieved in consideration of the circumstances, and its object is to provide an electronic device capable of reducing acoustic noise.

The present inventors have found out that acoustic noise of an electronic device with an external terminal can be reduced by limiting a bonding region between a terminal electrode and an external terminal, and have accomplished the present invention.

That is, the electronic device according to the present invention comprises:

a chip component having a terminal electrode formed on an end surface of an element body; and an external terminal electrically connected to the terminal electrode, wherein the external terminal comprises:

a terminal electrode connection part arranged to face an end surface electrode part of the terminal electrode;

a mounting connection part connectable to a mounting surface; and a support part facing one side surface of the element body closest to the mounting surface so as to support the one side surface spaced from the mounting surface, and wherein a bonding region and a non-bonding region are formed between the terminal electrode connection part of the external terminal and the end surface electrode part of the terminal electrode and the non-bonding region is formed from the terminal electrode connection part to the support part.

Acoustic noise is a phenomenon where audible noise occurs due to vibration of a mounting board at frequency within an audible range. The reason for the vibration is considered that vibration caused by electro-strictive effect at the time of application of high frequency voltage to ceramic layers constituting most of the element body transmits to the external terminal and/or the mounting surface. The present inventors have found out that acoustic noise can be reduced by forming the non-bonding region from the terminal electrode connection part to the support part. The reason of this is not necessarily clear, but it is considered that the non-bonding region functions as a buffer region of vibration and that electro-strictive vibration of the chip capacitor is hard to transmit to the mounting surface.

The non-bonding region may include a clearance between the external terminal and the terminal electrode, or they may be contacted with each other. It is considered that the non-bonding region functions as a buffer region of vibration due to no connection of solder, conductive adhesive etc., and that acoustic noise is prevented.

Preferably, a joint part connects the terminal electrode connection part and the mounting connection part and the support part protrudes to the one side surface of the element body at a boundary position between the terminal electrode connection part and the joint part and is integrally formed with the terminal electrode connection part. This configuration allows the support part to be easily formed, and particularly allows the external terminal to securely hold the chip component before or during junction operation by solder, conductive adhesive etc.

Preferably, the joint part and the support part are dislocated along a width direction of the terminal electrode connection part, the support part is comprised of a pair of support parts protruding from both sides along the width direction of the terminal electrode connection part toward the one side surface of the element body, and the mounting connection part and the support part are formed not to overlap each other seen from a direction vertical to the mounting surface at a vicinity of the end surface of the element body.

This configuration can prevent solder of the mounting connection part from reaching the support part and can prevent a so-called solder bridge phenomenon. Acoustic noise is apt to occur by generation of solder bridge, and thus solder bride is desired to be reduced. For being able to reduce solder bridge, the space between the mounting surface and the chip component can be 0.2 mm or less, for example, which contributes to thinning of the device as a whole.

Preferably, a width (W1) of the joint part along a direction parallel to the mounting surface is smaller than a width (W0) of the terminal electrode connection part. This configuration prevents electro-strictive vibration of the chip capacitor from transmitting to the mounting surface, and thus acoustic noise can be further reduced.

Preferably, a ratio (W1/W0) of the width (W1) of the joint part to the width (W0) of the terminal electrode connection part is 0.3 to 0.8, more preferably 0.5 to 0.7. In this relation, prevention effect of acoustic noise is improved, and mechanical strength of the external terminal can be ensured sufficiently.

Any method can be selected for forming the non-bonding region. For example, when using solder for junction, the non-bonding region can be formed by performing a treatment for preventing solder adhesion onto the surface of the external terminal facing the terminal electrode. The treatment for preventing solder adhesion includes a laser exfoliation treatment, a resist coating treatment, a limiting treatment of plating area, and a treatment for forming solder reservoir.

The treatment for preventing solder adhesion may be performed to the terminal electrode as well. When the bonding region is formed using conductive adhesive, which is not solder, the non-bonding region can be formed by limiting the coating area of the conductive adhesive. Preferably, the bonding region is formed using solder. This is because junction strength can be improved, and electric resistance can be reduced.

DESCRIPTION OF THE PREFERRED EMBODIMENTS

Hereinafter, the present invention will be explained based on embodiments shown in the figures.

First Embodiment

Figure 1:
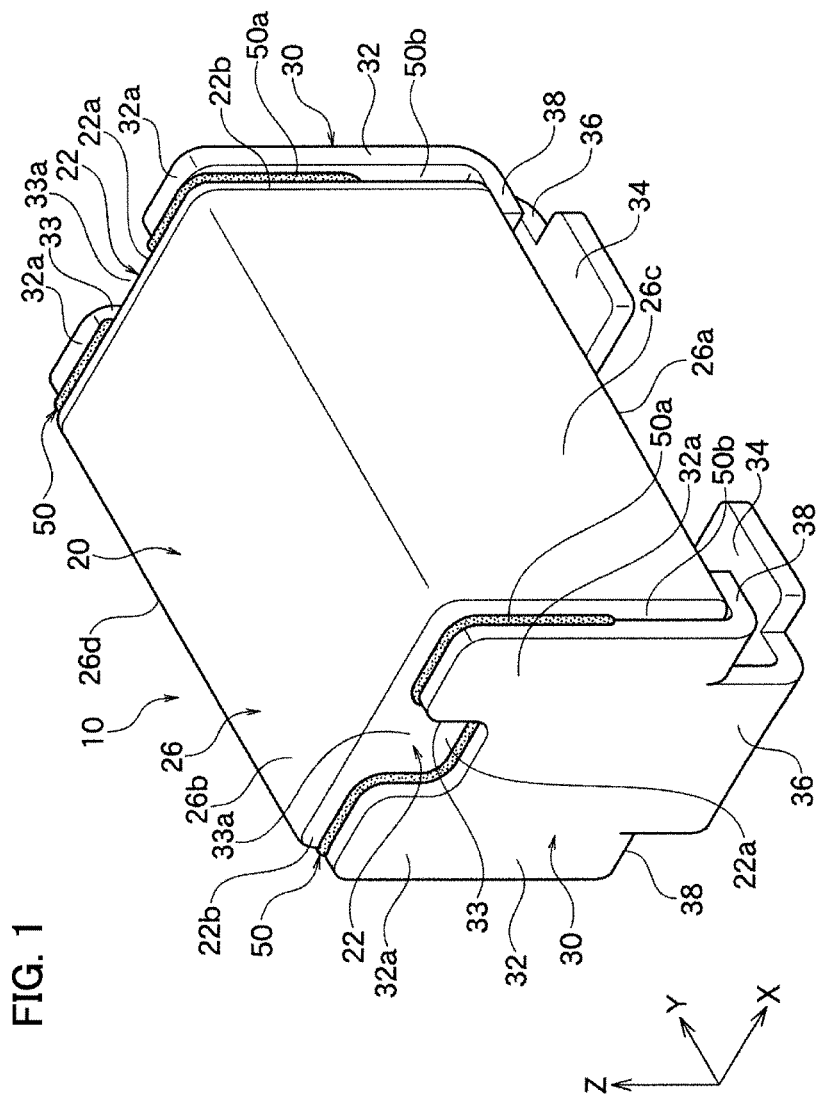
FIG. 1 is a perspective view of an electronic device according to one embodiment of the present invention.

FIG. 1 is a schematic perspective view showing a ceramic capacitor 10 as an electronic device according to the first embodiment of the present invention. The ceramic capacitor 10 has a chip capacitor 20 as a chip component and a pair of metal terminals (external terminals) 30 respectively attached on both end surfaces in the Y-axis direction of the chip capacitor 20.

Note that, in each embodiment, a ceramic capacitor having a pair of the metal terminals 30 attached to the chip capacitor 20 is explained as an example. However, a ceramic electronic device of the present invention is not limited thereto, and the metal terminals 30 may be attached to a chip component other than a capacitor.

Figure 2:
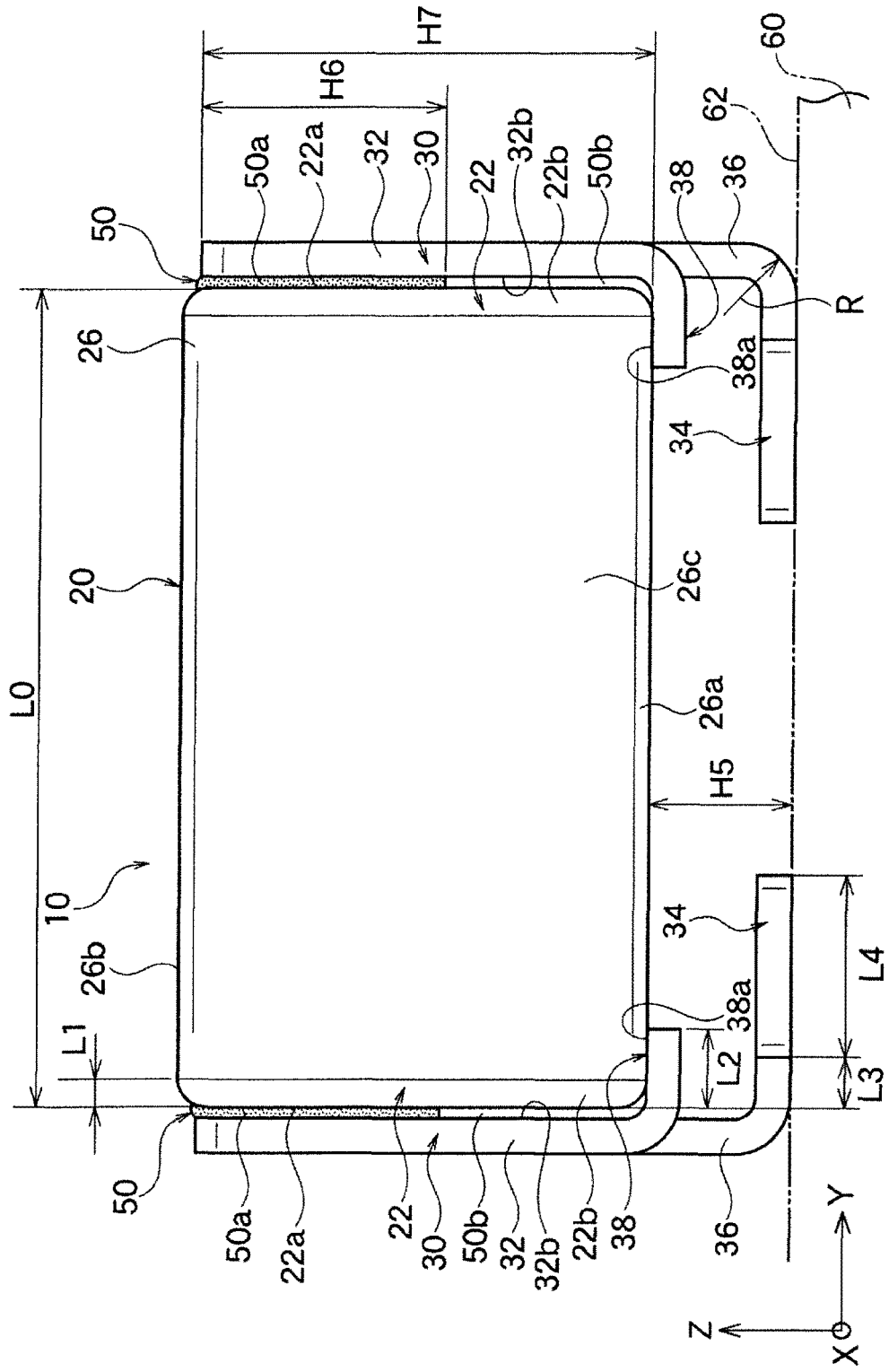
FIG. 2 is a front view of the electronic device shown in FIG. 1.
Figure 3:
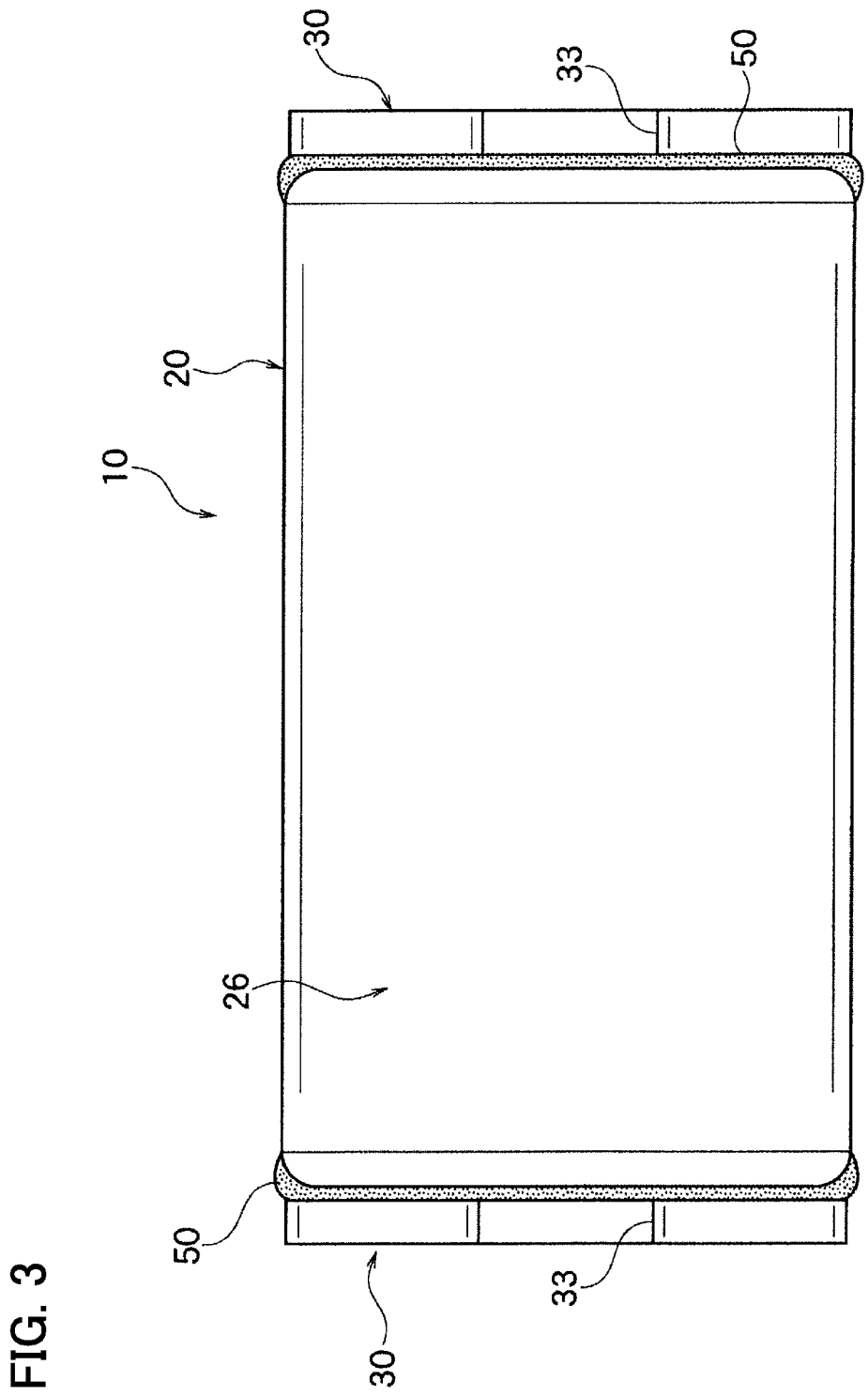
FIG. 3 is a plane view of the electronic device shown in FIG. 1.

The chip capacitor 20 has a capacitor element body 26 and a pair of terminal electrodes 22 respectively formed on both end surfaces in the Y-axis direction of the capacitor element body 26. The capacitor element body 26 has four side surfaces 26a, 26b, 26c, and 26d, which are approximately vertical to the end surfaces in the Y-axis direction. As shown in FIG. 2, the side surface 26a of the side surfaces is a bottom surface closest to a mounting surface 62 of a circuit board 60. In the present embodiment, the side surface 26b opposing to the bottom surface 26a in parallel is a top surface. The other side surfaces 26c and 26d are placed approximately vertical to the mounting surface 62.

In the figures, the X-axis, the Y-axis, and the Z-axis are vertical to each other. The Z-axis is the direction vertical to the mounting surface 62. The Y-axis is the direction vertical to the end surfaces of the element body 26. The X-axis is the direction vertical to the side surface 26c and the side surface 26d.

The capacitor element body 26 has dielectric layers as ceramic layers and internal electrode layers therein, and both layers are alternatively laminated. The dielectric layers is made of any material, and are composed of dielectric material such as calcium titanate, strontium titanate, barium titanate, or mixture thereof, for example. Each of the dielectric layers has any thickness, but commonly has a thickness of several μm to several hundred μm.

Conductive materials contained in the inner electrode layers are not limited, and a comparatively cheap base metal can be used when a constituent material of the dielectric layers has reduction resistant. Ni or a Ni alloy is preferable as the base metal. As the Ni alloy, an alloy of Ni and one or more elements selected from Mn, Cr, Co, and Al is preferable, and the alloy preferably contains Ni of 95 wt % or more. Note that, Ni or the Ni alloy may contain various minor components, such as P, of approximately 0.1 wt % or less. Also, the inner electrode layers may be formed using a commercially available paste for electrodes. The thickness of the inner electrode layers is properly determined based on the usage and the like.

The terminal electrodes 22 is also made of any material. The terminal electrodes 22 is usually made of copper, copper alloy, nickel, or nickel alloy etc., but can be further made of silver or alloy of silver and palladium. The terminal electrodes 22 have any thickness, but usually have a thickness of 10 to 50 μm or so. Note that, a coating film made of at least one kind metal selected from Ni, Cu, and Sn etc. may be formed on the surface of the terminal electrodes 22. In particular, Cu baked layer/Ni plating layer/Sn plating layer is preferable.

Also, in the present embodiment, the terminal electrodes 22 are preferably composed of multilayer electrode films having at least resin electrode layers. The resin electrode layers absorb vibration, which can further effectively prevent acoustic noise mentioned below. The terminal electrodes 22 having the resin electrode layers are preferably made of baked layer, resin electrode layer, Ni plating layer, and Sn plating layer in order from the side in contact with the element body 26, for example.

Also, as shown in FIG. 2, the terminal electrodes 22 have end surface electrode parts 22a and side surface electrode parts 22b. The end surface electrode parts 22a are respectively located on both end surfaces in the Y-axis direction of the element body 26 and cover the end surfaces. The side surface electrode parts 22b are integrally formed with the end surface electrode parts 22a so as to cover from the end surfaces of the element body 26 to the multiple side surfaces 26a to 26d close to the end surfaces at a predetermined coating width L1.

In the present embodiment, the side surface electrode parts 22b may not be substantially formed, and the terminal electrodes 22 are preferably substantially composed of only the end surface electrode parts 22a. Even if the side surface electrode parts 22b are formed, a protruding length L2 in the Y-axis direction of supporting parts 38 of the metal terminals 30 mentioned below is preferably longer than the coating width L1 of the side surface electrode parts 22b. This configuration can effectively prevent solder bridge between the terminal electrodes 22 and mounting connection parts 34.

As shown in FIG. 1 to FIG. 10, each of the metal terminals 30 has terminal electrode connection parts 32 and the mounting connection parts 34. The terminal electrode connection parts 32 are arranged to face the end surface electrode parts 22a of the terminal electrodes 22 formed on the end surfaces in the Y-axis direction of the element body 20. The mounting connection parts 34 are connectable to the mounting surface 62. As shown in FIG. 2, the terminal electrode connection parts 32 and the mounting connection parts 34 are connected by joint parts 36 formed integrally therewith so that the bottom surface 26a of the element body 26 closest to the mounting surface 62 is spaced with a predetermined distance H5 to the mounting surface 62. The metal terminals 30 have any thickness, but preferably have a thickness of 0.05 to 0.10 mm.

The joint parts 36 have a bent shape folded from the terminal electrode connection parts 32 to the direction (inwardly) of the bottom surface 26a so that the mounting connection parts 34 face the bottom surface 26a at a predetermined distance (distance where the thickness of the mounting connection parts 34 are subtracted from the predetermined distance H5). An outer bending radius R of the bent shape is obtained by a relation with the predetermined distance H5 or so. The outer bending radius R is as long as the predetermined distance H5 or shorter, and is preferably 0.3 times or longer than the predetermined distance H5. This configuration contributes to downsizing of the components and improves prevention effect of acoustic noise.

Figure 4:
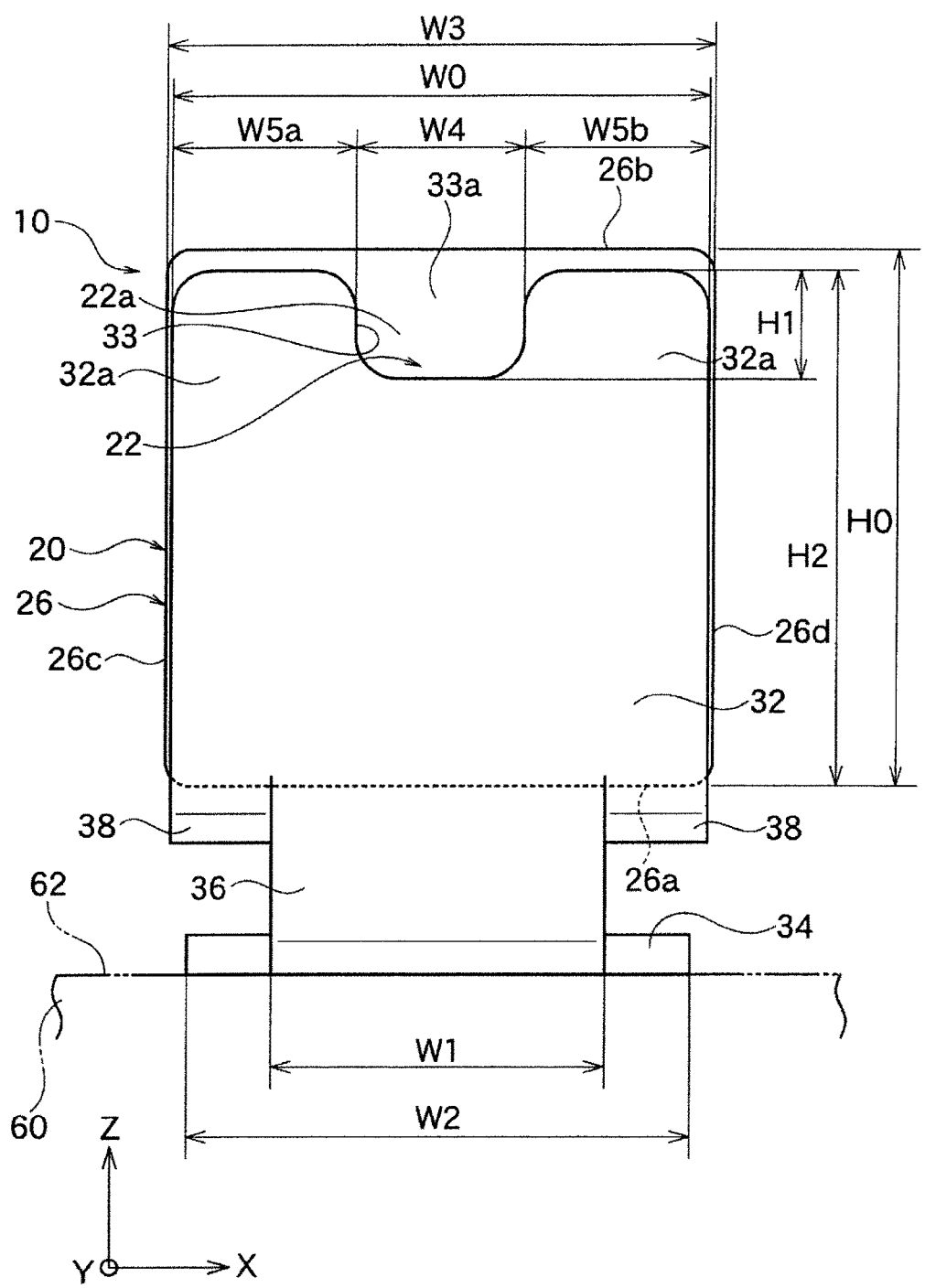
FIG. 4 is a right side surface view (a left side surface view has the same shape) of the electronic device shown in FIG. 1.

As shown in FIG. 4, a width W1 of the joint parts is smaller than a width W0 of the terminal electrode connection parts 32. A ratio W1/W0 of the width W1 of the joint parts 36 to the width W0 of the terminal electrode connection parts 32 is preferably 0.3 to 0.8 and more preferably 0.5 to 0.7. In this relation, prevention effect of acoustic noise is enhanced, and further mechanical strength of the metal terminals can be sufficiently ensured. Note that, the width W0 of the terminal electrode connection parts 32 may be approximately the same or a little smaller than a X-axis direction width W3 of the element body 26. W3/W0 is preferably 1.0 to 1.4.

High frequency voltage is applied to the ceramic layers composing most of the element body 26, and vibration occurs by electro-strictive effect. Then, the vibration transmits to the metal terminals 30 and/or the mounting surface 62. As a result, acoustic noise is considered to be generated. In the present embodiment, since the width W1 of the joint parts 36 is smaller than the width W0 of the terminal electrode connection parts 32, electro-strictive vibration of the chip capacitor 20 is hard to transmit to the mounting surface 62, which can also reduce acoustic noise.

As shown in FIG. 1, grooves 33 whose shape does not cover a part of the end surfaces of the element body 26 are formed on the terminal electrode connection parts 32 so as not to reach the joint parts 36. As shown in FIG. 4, the grooves 33 have openings 33a, which are open toward the top surface 26b of the element body 26 located at the opposite side of the mounting surface 62. Preferably, the grooves 33 are formed on middle areas in the X-axis direction (width direction) of the terminal electrode connection parts 32. Further, a pair of connection pieces 32a and 32a connected to the end surface electrode parts 22a is preferably formed on the terminal electrode connection parts 32 located at both sides of the grooves 33.

As shown in FIG. 4, a ratio (W4/W0) of a X-axis direction width W4 of the grooves 33 to the width W0 of the terminal electrode connection parts 32 is preferably 0.3 to 0.5. Note that, each width W5a and W5b of the connection pieces 32a and 32a formed at both sides in the X-axis direction of the grooves 33 may be the same or different. Also, a depth H1 in the Z-axis direction of the grooves 33 is not limited, but preferably determined by a relation with a Z-axis direction height H0 of the element body 26. H1/H0 is preferably 0 to 1, more preferably 0.1 to 0.6. In this relation, the terminal electrodes 22 and the metal terminals 30 are particularly easily connected, connecting strength is improved, and further solder bridge can be prevented.

Note that, a Z-axis direction height H2 of the terminal electrode connection parts 32 from the bottom surface 26a of the element body 26 is preferably as long as the Z-axis direction height H0 of the element body 26, or may be a little smaller. That is, H2/H0 is preferably 0.7 to 1.0.

In the present embodiment, even if a small chip capacitor 20 (e.g., 1 mm×0.5 mm×1 mm or less) is used, forming the grooves 33 makes it easier to connect the terminal electrode connection parts 32 of the metal terminals 30 and the end surface electrode parts 22a of the terminal electrodes 22 by such as a solder 50 and makes connecting strength thereof improved. Also, forming the grooves 33 makes it easier to confirm the connection between the metal terminals 30 and the terminal electrodes 22 and makes it possible to effectively prevent connection failure. Further, since the grooves 33 do not reach the joint parts 36, no through holes due to the grooves 33 are formed at the joint parts 36, and there is no risk that solder bridge occurs due to receiving solder in a through hole.

As shown in FIG. 4, in the present embodiment, a width W2 of the mounting connection parts 34 is larger than the width W1 of the joint parts 36 along the same direction (X-axis) as the width W1 of the joint parts. This configuration improves connecting strength between the mounting connection parts 34 and the mounting surface 62. Also, the width W2 of the mounting connection parts is preferably substantially equal to the width W3 of the element body 26 along the same direction as the width W1 of the joint parts, but may be a little smaller than the width W3 of the element body 26. That is, W2/W3 is preferably 0.7 to 1.0. In this configuration, the connecting strength between the mounting connection parts 34 and the mounting surface 62 are improved, the mounting connection parts 34 do not become large more than necessary (no protrusions from the X-axis direction width W3 of the element body 26), and the device is downsized.

As shown in FIG. 2, a Y-axis direction distance L3 from a boundary position between the mounting connection parts 34 and the joint parts 36 to the end surfaces of the element body 26 is determined by such as a relation of the protruding length L2 of the support parts 38, and L3/L2 is preferably 0.6 to 1.0. Also, a Y-axis direction length L4 of the mounting connection parts 34 is determined by such as a relation of a Y-axis direction length L0 of the element body 26, and L4/L0 is preferably 0.2 to 0.4.

In the present embodiment, the support parts 38 protruding toward the bottom surface 26a of the element body 26 and holding the bottom surface 26a are integrally formed with the terminal electrode connection parts 32 at a boundary position between the terminal electrode connection parts 32 and the joint parts 36. The support parts 38 are comprised of a pair of the support parts 38 and 38 protruding from both sides along the width direction (X-axis) of the terminal electrode connection parts 32 toward the bottom surface 26a of the element body 26.

In the present embodiment, as shown in FIG. 2, bonding regions 50a and non-bonding regions 50b are formed between the terminal electrode connection parts 32 of the metal terminals 30 and the end surface electrode parts 22a of the terminal electrodes 22, and the non-bonding regions 50b are formed from the terminal electrode connection parts 32 to the support parts 38.

In the bonding regions 50a, the solder 50 mechanically and electrically joins the terminal electrode connection parts 32 of the metal terminals 30 and the end surface electrode parts 22a of the terminal electrodes 22. In the non-bonding regions 50b, there is no solder 50, and solder does not join the terminal electrode connection parts 32 of the metal terminals 30 and the end surface electrode parts 22a of the terminal electrodes 22. The non-bonding regions 50b are continuously formed from the terminal electrode connection parts 32 to the support parts 38.

In the present embodiment, the non-bonding regions 50b are formed from the terminal electrode connection parts 32 to the support parts 38, which can reduce acoustic noise. The reason of this is not necessarily clear, but it is considered that the non-bonding regions 50b function as buffer regions of vibration and that electro-strictive vibration of the chip capacitor 20 is hard to transmit to the mounting surface 62.

The bonding regions 50a are preferably formed in a range of a predetermined height H6 from the upper end to below in the Z-axis direction of the terminal electrode connection parts 32. The height H6 for forming the bonding regions 50a is smaller than a height H7 from the upper end in the Z-axis direction of the terminal electrode connection part 32 to upper surfaces 38a of the support parts 38. Although not limited, H6/H7 is preferably 0.2 to less than 1.0, more preferably 0.3 to 0.9, and still more preferably 0.4 to 0.8. It is at least confirmed that even if H6/H7 is varied within the range, acoustic noise phenomenon can be decreased and that the metal terminals 30 and the terminal electrodes 22 are joined sufficiently.

Figure 6:
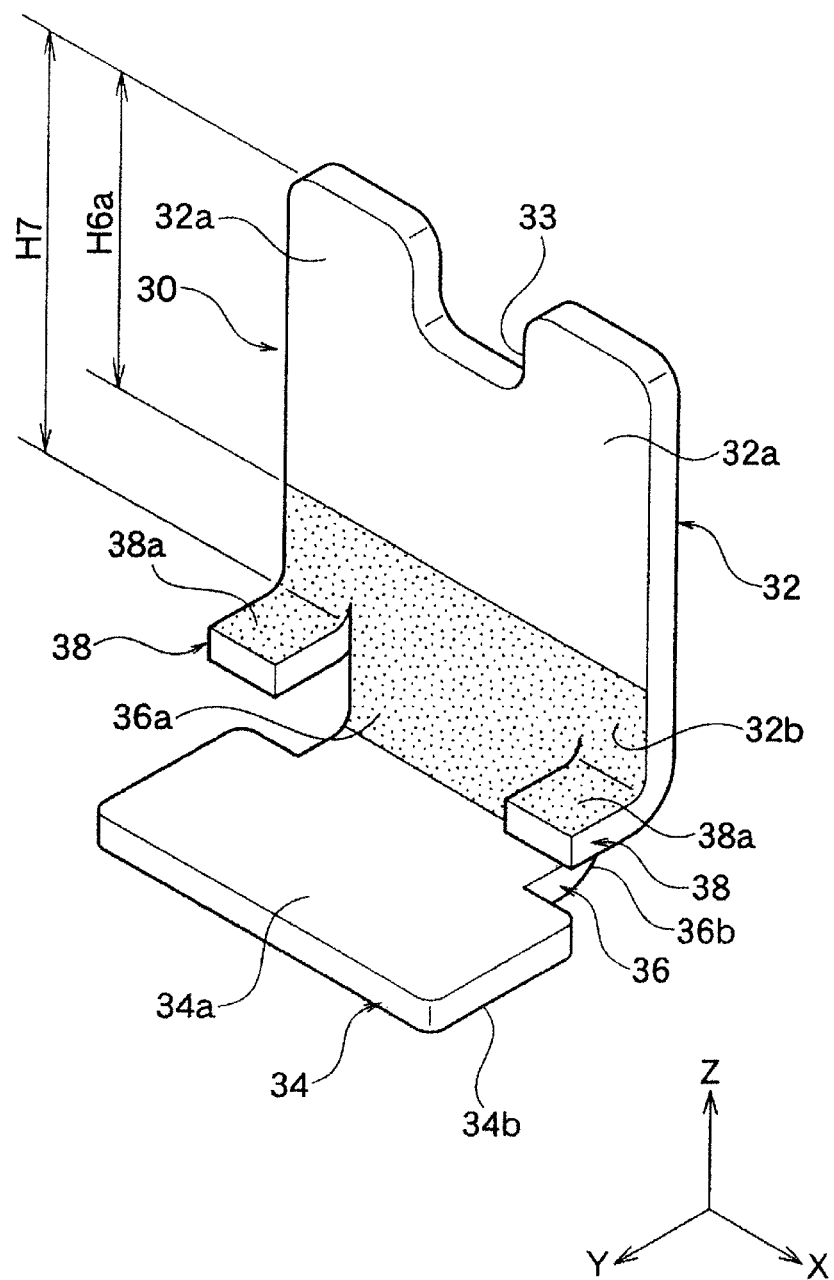
FIG. 6 is a perspective view of an external terminal shown in FIG. 1.

Any method can be selected for forming the non-bonding regions 50b from the lower position (the lower end of the height H6) of the terminal electrode connection parts 32 to the support parts 38. For example, as shown in FIG. 6, at least a solder adhesion preventing region (a hatched region with dots in FIG. 6) may only be formed on the upper surfaces 38a of the support parts 38. The solder adhesion preventing region is formed not only on the upper surface 38a of the support part 38, but on an opposing surface 32b located nearby to the end surface electrode part 22a of the terminal electrode connection part 32. Further, the solder adhesion preventing region may be formed continuously at least to a part of an inner surface 36a of the joint part 36.

Figure 11:
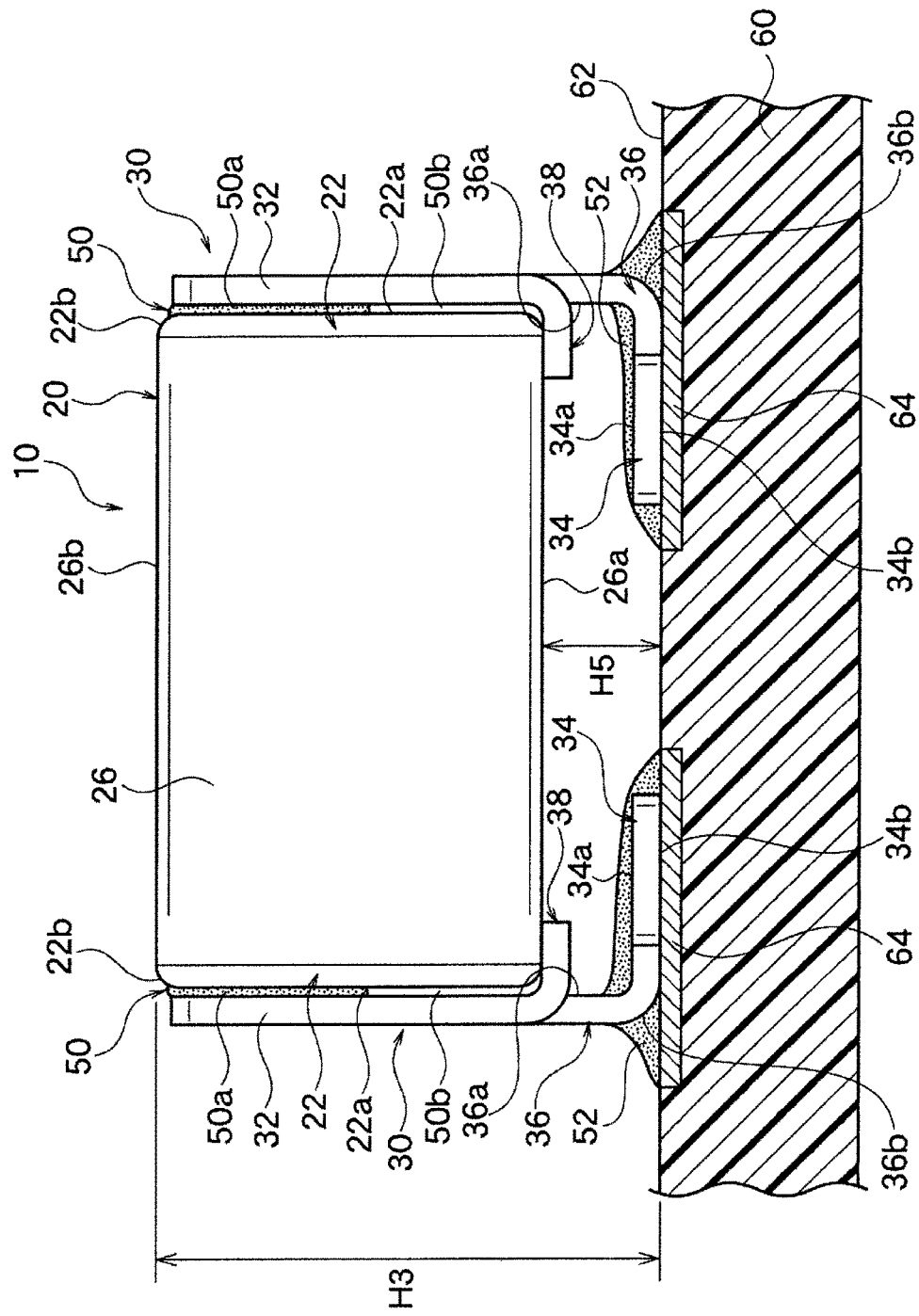
FIG. 11 is a schematic view showing how the electronic device shown in FIG. 1 is mounted.

Note that, as shown in FIG. 11, no solder adhesion preventing regions are preferably formed on top surfaces 34a or bottom surfaces 34b of the mounting connection parts 34 so that the solder 52 is bonded to firmly connect the mounting connection parts 34 with the mounting surface 62 of the circuit board 60. Also, no solder adhesion preventing regions are preferably formed on outer surfaces 36b of the joint parts 36 so that the solder 52 is bonded to firmly connect the mounting connection parts 34 with the mounting surface 62 of the circuit board 60. The solder 52 may not be necessarily bonded on the top surfaces 34a of the mounting connection parts 34, and thus the solder adhesion preventing region may be continuously formed thereon.

Figure 7A:
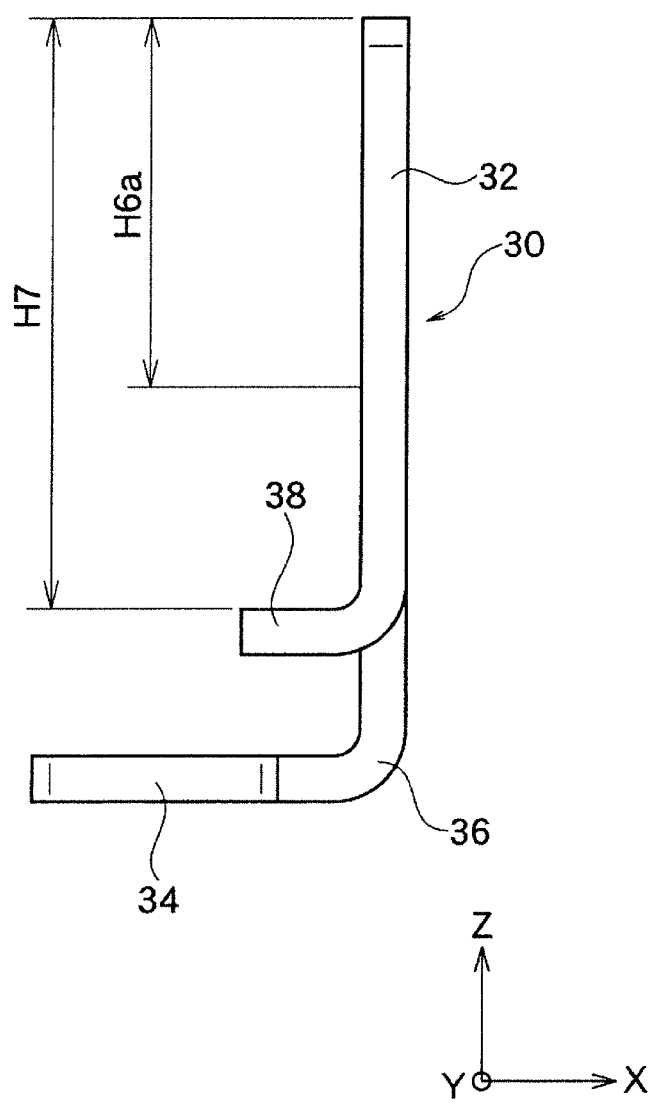
FIG. 7A is a front view of the external terminal shown in FIG. 6.

In the terminal electrode connection part 32 of the metal terminal 30 shown in FIG. 6 and FIG. 7A, a height H6a in the Z-axis direction with no solder adhesion preventing region is substantially the same as the height H6 of the bonding regions 50a shown in FIG. 2, but may not be necessarily the same according to the amount of the solder 50.

Note that, FIG. 2 or so illustrates that a pair of the support parts 38 is contacted with the bottom surface 26a of the element body 26, but may not be necessarily contacted in reality. Also, FIG. 2 or so illustrates that the non-bonding regions 50b include clearances between the end surface electrode parts 22a and the terminal electrode connection parts 32, but the clearances are not necessarily present therebetween all the time. They may be partly contacted with each other, but this is not joined by the solder 50.

The respective width in the X-axis direction of a pair of the support parts 38 and 38 is preferably the same, but may not be necessarily the same. In the present embodiment, as shown in FIG. 2, the joint parts 36 and the support parts 38 are dislocated along the X-axis direction, and the metal terminals 30 are folded from the terminal electrode connection parts 32 toward the side of the bottom surface 26a of the element body 26.

In the present embodiment, the support parts 38 enable the metal terminals 30 to securely hold the chip capacitor 20 before or during junction by the solder 50, and the soldering operation becomes easy. The metal terminals 30 may be slightly distorted due to the junction by the solder 50, and the support parts 38 may not be contacted with the bottom surface 26a of the chip capacitor 20 after the joint, but this is not a problem at all and is rather preferable from a viewpoint of prevention of acoustic noise.

Figure 5:
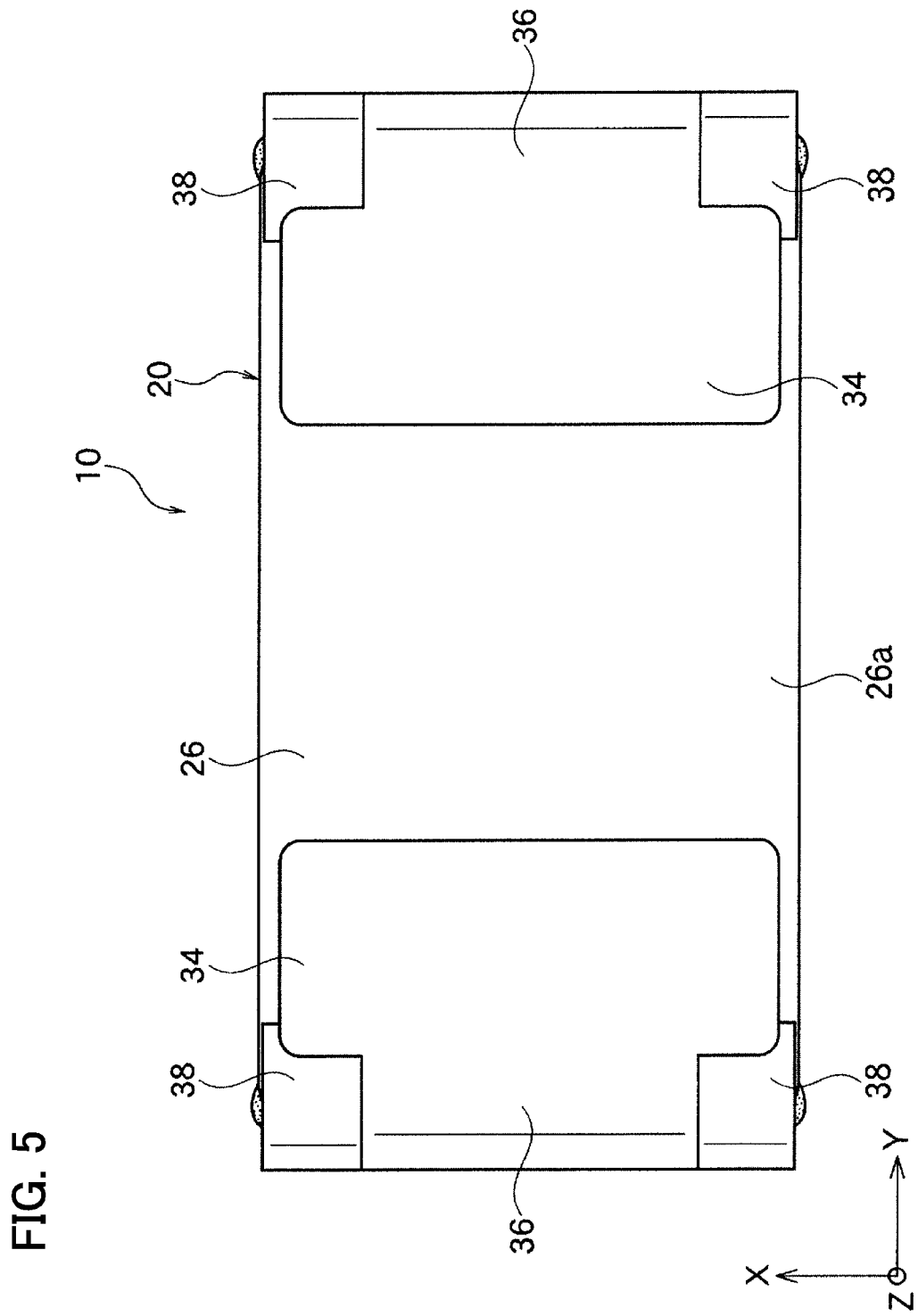
FIG. 5 is a bottom view of the electronic device shown in FIG. 1.

In the present embodiment, as shown in FIG. 5, a vicinity of both side surfaces in the Y-axis direction of the element body 26 has portions where the mounting connection parts 34 and the support parts 38 do not overlap each other seen from a vertical direction (Z-axis direction) to the mounting surface. This configuration can effectively prevent extension of the solder 52 connecting circuit patterns 64 formed on the mounting surface 62 and the mounting connection parts 34 to the support parts 38, and can prevent a so-called solder bridge phenomenon, as shown in FIG. 11.

When solder bridge is generated, acoustic noise is easily generated. Thus, solder bridge is desired to be reduced. Note that, solder bridge can be reduced, which enables a gap (H5) between the mounting surface 62 and the chip component 20 to be 0.2 mm or less, for example. This can reduce a height H3 of the entire device and contributes to thinning of the device.

The shape and size of the chip capacitor 20 are properly determined based on the purpose and usage. When the chip capacitor 20 has a rectangular parallelepiped shape, the size is usually length (0.6 to 5.6 mm)×width (0.3 to 5.0 mm)×thickness (0.1 to 5.6 mm) or so.

Method for Manufacturing the Ceramic Capacitor 10

Hereinafter, a method for manufacturing the ceramic capacitor 10 will be explained. First, the chip capacitor 20 is manufactured. In order to form green sheets to be dielectric layers after firing, paint for the green sheets is prepared. In the present embodiment, the paint for the green sheets is composed of organic solvent-based paste obtained by kneading a raw material of dielectric material and organic vehicle, or composed of aqueous paste.

The raw material of dielectric material is properly selected from various compounds such as carbonate, nitrate, hydroxide, and organometallic compound to be calcium titanate, strontium titanate, and barium titanate after firing. They can be used by mixing.

Next, green sheets are formed on carrier sheets using the above paint for the green sheets. Next, electrode patterns to be inner electrode layers after firing are formed on one of the surfaces of the green sheets. The electrode patterns are formed by any method, and printing method, transfer method, or thin film method is used, for example. The green sheets are dried after forming the electrode patterns thereon. Then, the green sheets on which the electrode patterns are formed are obtained.

Ni, Ni alloy, or mixture thereof is preferably used as a conductor material used in the manufacture of paste for inner electrode layers. The conductor material has any shape, such as spherical or scaly, or may have shape of mixture thereof.

Next, the green sheets with the inner electrode patterns are laminated until a desired lamination number is obtained while being peeled from the career sheets, and a green multilayer body is obtained. Note that, at the first and the last time of the lamination, green sheets for outer layers without the inner electrode patterns are laminated.

Thereafter, the green multilayer body is finally pressurized, polished if necessary, and debinded. Then, a green chip is fired. The firing condition is not limited. After the firing, anneal treatment or polishing etc. is performed if necessary. As a result, the capacitor element body 26 shown in FIG. 1 is obtained.

Thereafter, the terminal electrodes 22 are formed on the capacitor element body 26. Base electrodes are formed by baking paste for terminal electrodes, metal coating film is formed by plating on surface of the base electrodes, and then the terminal electrodes 22 are formed, for example. Note that, the paste for the terminal electrodes can be prepared in the same way as the above-mentioned paste for the internal electrode layers.

When the terminal electrodes 22 having resin electrode layers are formed, the resin electrode layers are formed by forming the base electrodes consisted of baked layers on the end surfaces of the element body 26 and then coating resin electrode paste film thereon. Thereafter, Ni plating layers and Sn plating layers are formed.

First, in the manufacture of the metal terminals 30, a flat metal plate is prepared. The metal plate is made of any metal material with conductivity, and is made of iron, nickel, copper, silver, or alloy including them, for example.

Next, the metal plate is machined to obtain the metal terminals 30 shown in FIG. 6 to FIG. 10. The metal plate is machined by any method, but is preferably processed by press processing, for example. A metal coating film by plating may be formed on the surfaces of the metal terminals 30.

Any material can be used for the plating, but Ni, Cu, or Sn can be used, for example. A treatment for preventing solder adhesion is performed to predetermined regions on the surfaces of the metal terminals 30 by the following method, for example, after or during the plating treatment, and a solder adhesion preventing region is formed.

The terminal electrode connection parts 32 of the metal terminals 30 are connected to the terminal electrodes 22 formed on both end surfaces in the Y-axis direction of the chip capacitor 20 obtained as the above. In the present embodiment, they are connected by the solder 50, and the bonding regions 50a and the non-bonding regions 50b are formed as shown in FIG. 2. The non-bonding regions 50b are formed corresponding to the solder adhesion preventing region formed on the predetermined regions of the surfaces of the metal terminals 30.

The solder adhesion preventing region is formed as below. For example, when the entire surfaces of the metal terminals 30 are plated with tin or so and are easily adhered to solder, laser may only be irradiated to only where a solder adhesion preventing region is desired to be formed on the metal terminal 30. The laser irradiation removes the tin plating layer, and surface hard to be adhered to solder is exposed. As a result, the solder adhesion preventing region can be formed on the desired surface.

Alternatively, the solder adhesion preventing region may be formed on the desired surface by forming a resist layer for preventing adhesion of solder on only where the solder adhesion preventing region of the metal terminal 30 is desired to be formed. An ordinary soldering resist ink used for printed boards, for example, can be used as the resist layer, and its main component is made of curable epoxy resin. Alternatively, the solder adhesion preventing region may be formed on a region without tin plating obtained by performing tin plating on the surface of the metal terminals 30 in a limiting manner.

Figure 7B:
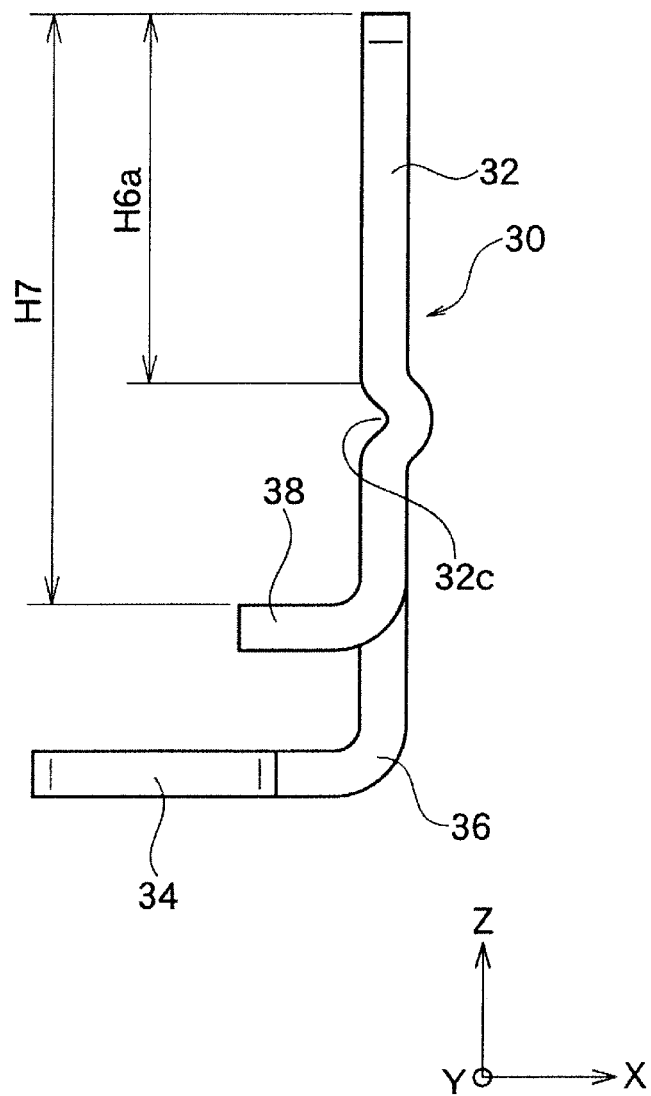
FIG. 7B is a front view of a variation of the external terminal shown in FIG. 7A.
Figure 8:
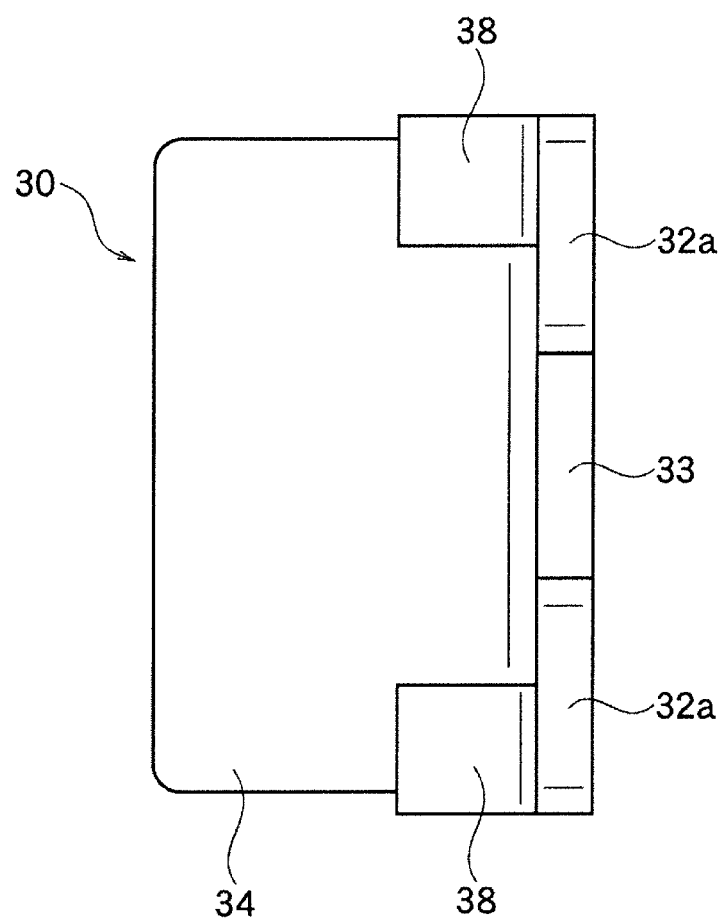
FIG. 8 is a plane view of the external terminal shown in FIG. 6.
Figure 9A:
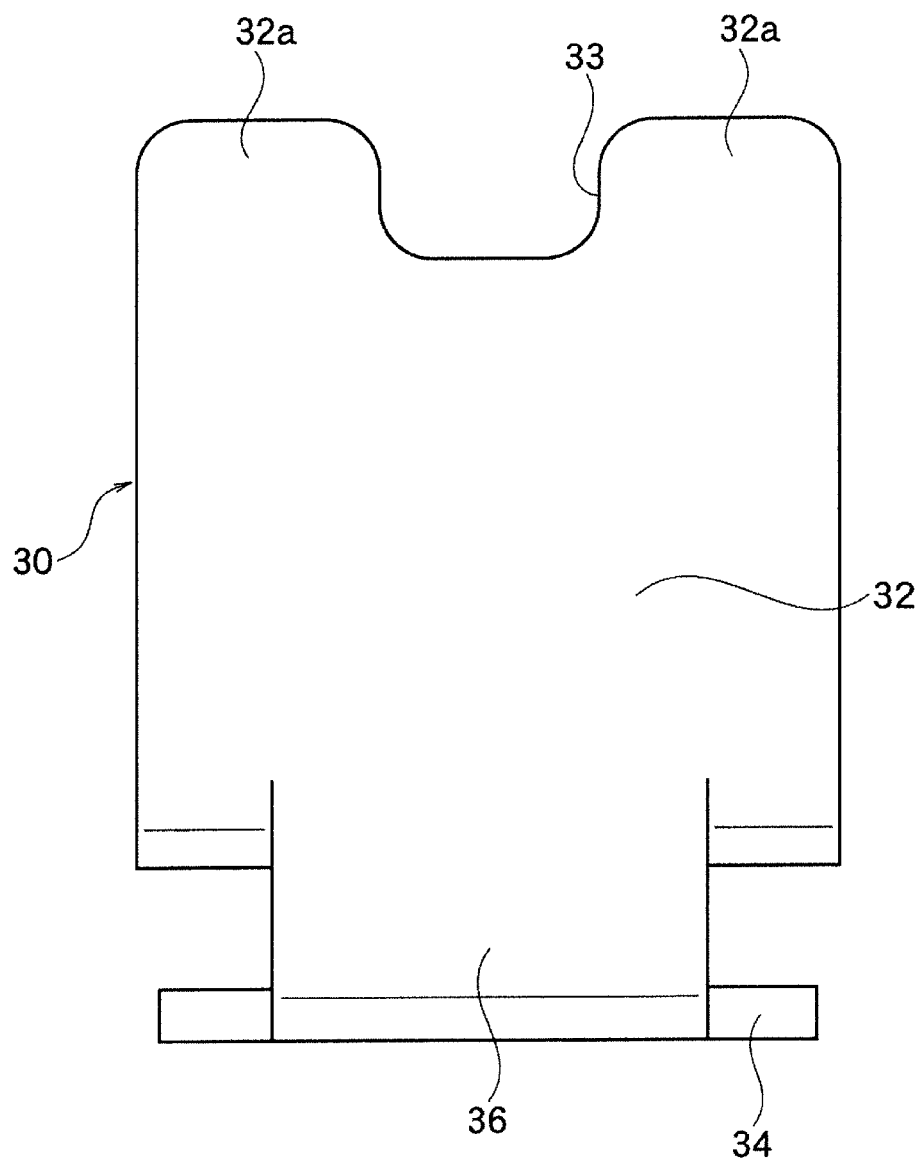
FIG. 9A is a right side surface view of the external terminal shown in FIG. 6.
Figure 9B:
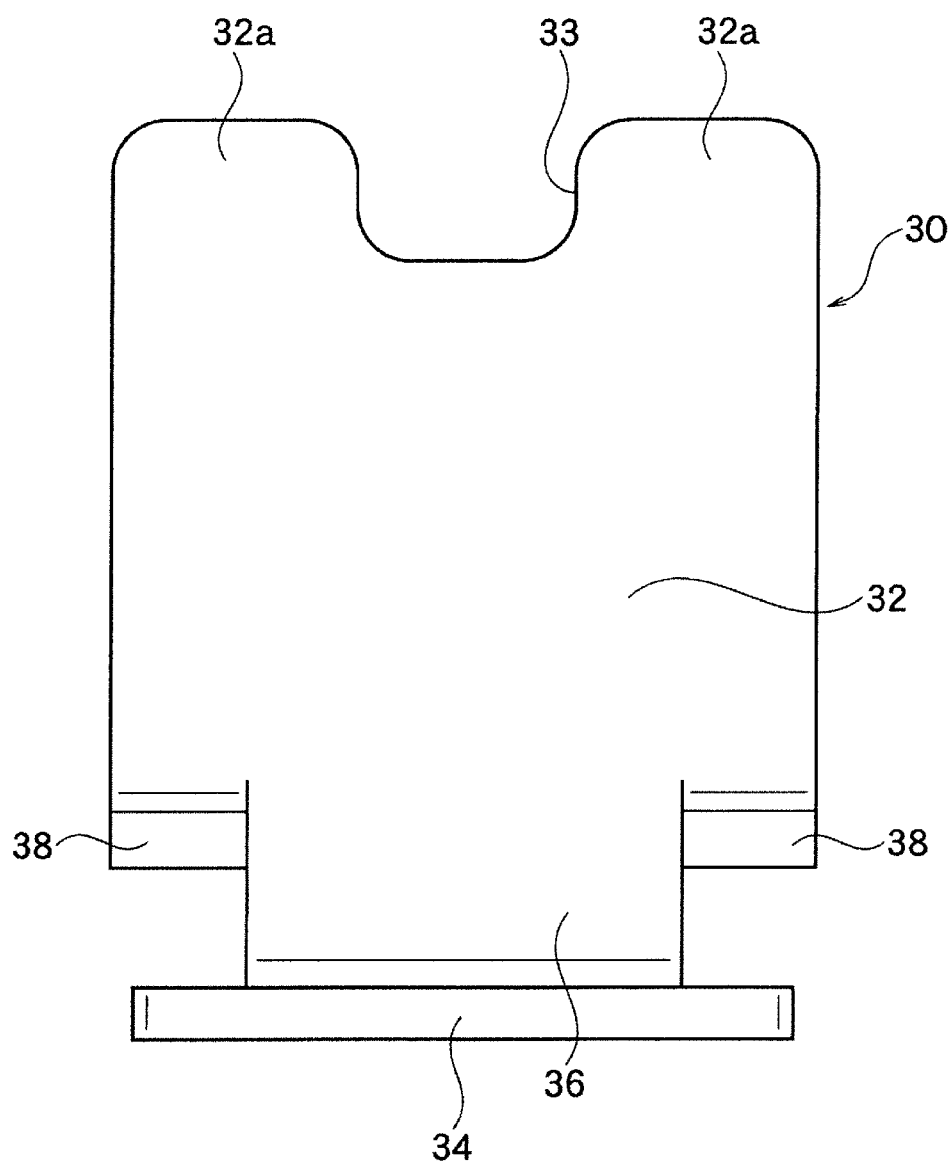
FIG. 9B is a left side surface view of the external terminal shown in FIG. 6.
Figure 10:
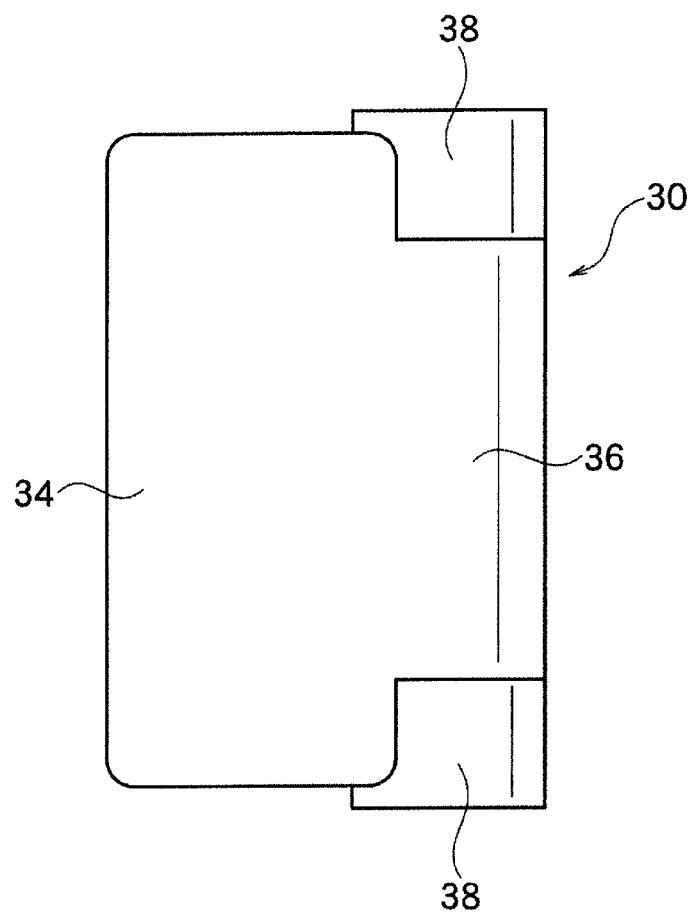
FIG. 10 is a bottom view of the external terminal shown in FIG. 6.

Alternatively, as shown in FIG. 7B, the solder adhesion preventing region may be formed below a solder saving recess 32c formed on the inner surface of the terminal electrode connection part 32 at a position of a predetermined height H6a from the upper end toward below in the Z-axis direction of the terminal electrode connection part 32. The recess 32c is preferably formed continuously in the Y-axis direction. An excessive solder is flowed into the recess 32c and saved therein, which prevents the solder 50 shown in FIG. 2 from reaching the support parts 38. Then, the non-bonding regions 50b are formed below the recess 32c.

Second Embodiment

Figure 12:
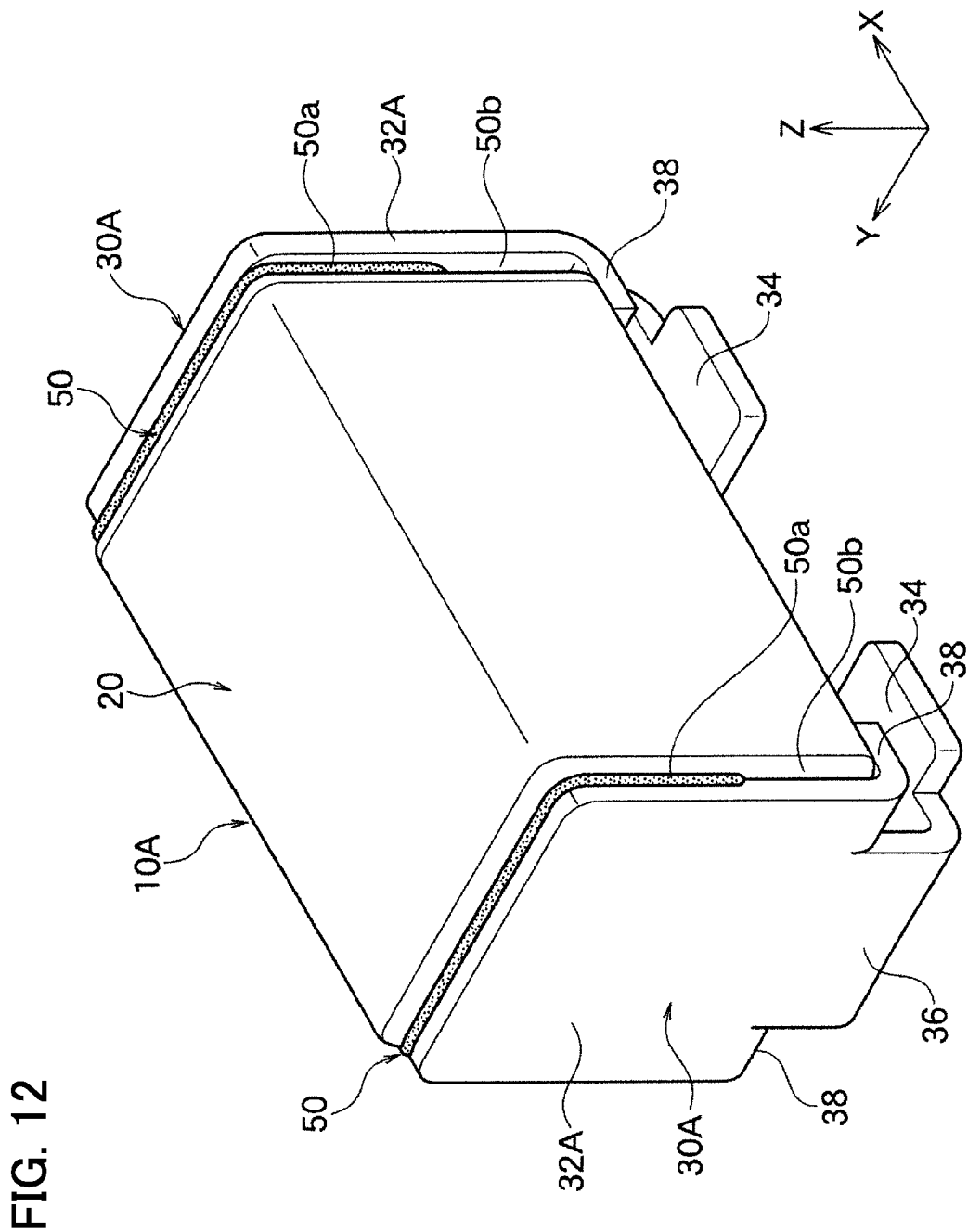
FIG. 12 is a perspective view of an electronic device according to another embodiment of the present invention.

FIG. 12 is a perspective view of a ceramic capacitor 10A according to the second embodiment of the present invention. The ceramic capacitor 10A according to the present embodiment has the same structure and effect as the ceramic capacitor 10 according to the first embodiment shown in FIG. 1 to FIG. 11 other than the following. Thus, common member number is distributed to common parts, and the common parts will not be explained.

As shown in FIG. 12, in the present embodiment, the grooves 33 shown in FIG. 1 are not formed on terminal electrode connection parts 32A of terminal electrodes 30A.

The ceramic capacitor 10A of the present embodiment has the same structure and effect as the ceramic capacitor 10 of the first embodiment, except that the grooves 33 shown in FIG. 1 are not formed.

Third Embodiment

Figure 13:
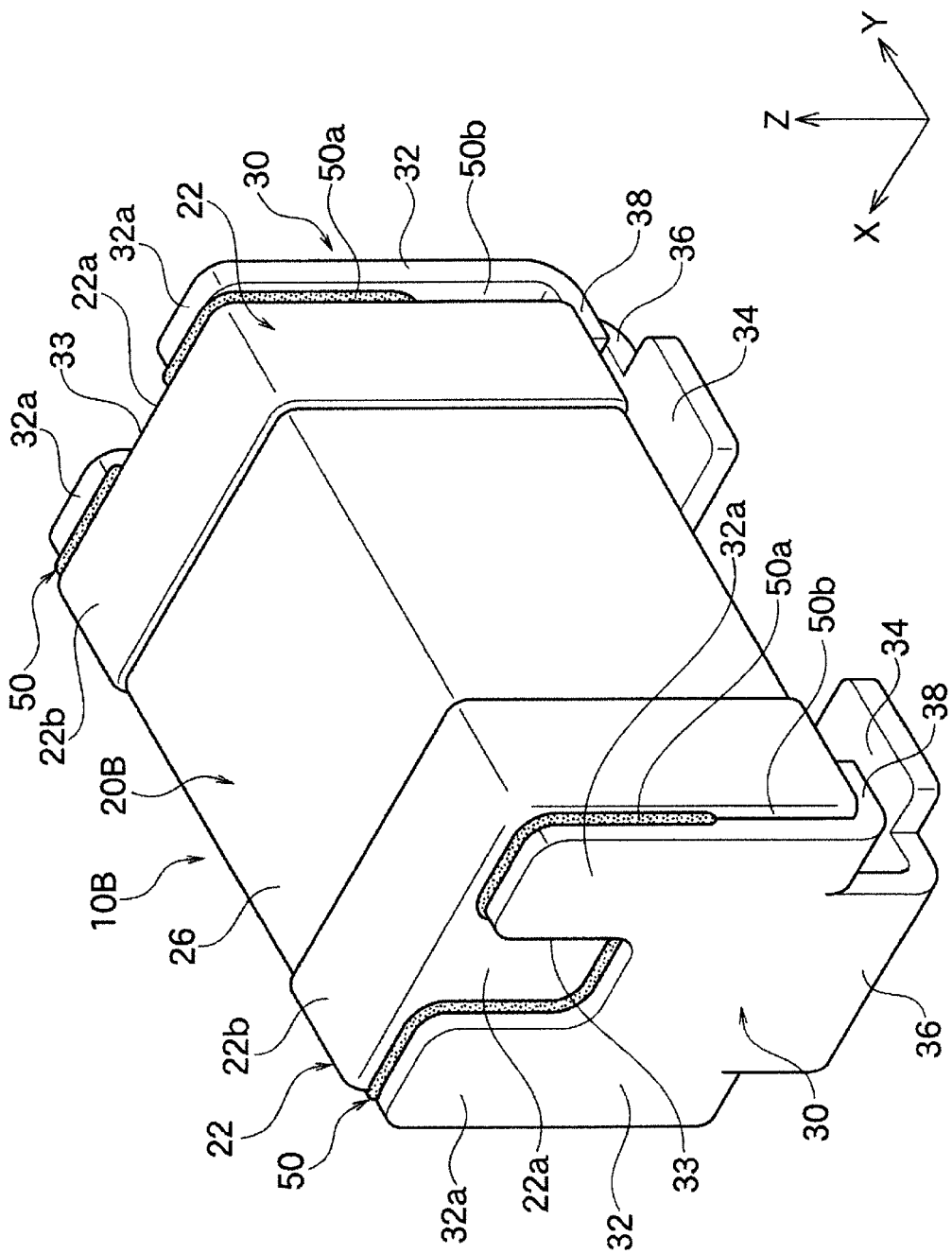
FIG. 13 is a perspective view of an electronic device according to still another embodiment of the present invention.

FIG. 13 is a perspective view of a ceramic capacitor 10B according to the third embodiment of the present invention. The ceramic capacitor 10B according to the present embodiment has the same structure and effect as the ceramic capacitor 10 according to the first embodiment shown in FIG. 1 to FIG. 11 other than the following. Thus, common member number is distributed to common parts, and the common parts will not be explained.

As shown in FIG. 13, in the present embodiment, a Y-axis direction length of side surface electrodes parts 22b of terminal electrodes 22 formed on end surfaces of an element body 26 of a chip capacitor 20B is longer than the Y-axis direction length of the side surface electrodes parts 22b of the terminal electrodes 22 of the first embodiment. The ceramic capacitor 10B of the present embodiment has the same structure and effect as the ceramic capacitor 10 of the first embodiment, except that the Y-axis direction length of the side surface electrodes parts 22b of the terminal electrodes 22 is longer than the Y-axis direction length of the side surface electrodes parts 22b of the terminal electrodes 22 of the first embodiment.

Fourth Embodiment

Figure 14:
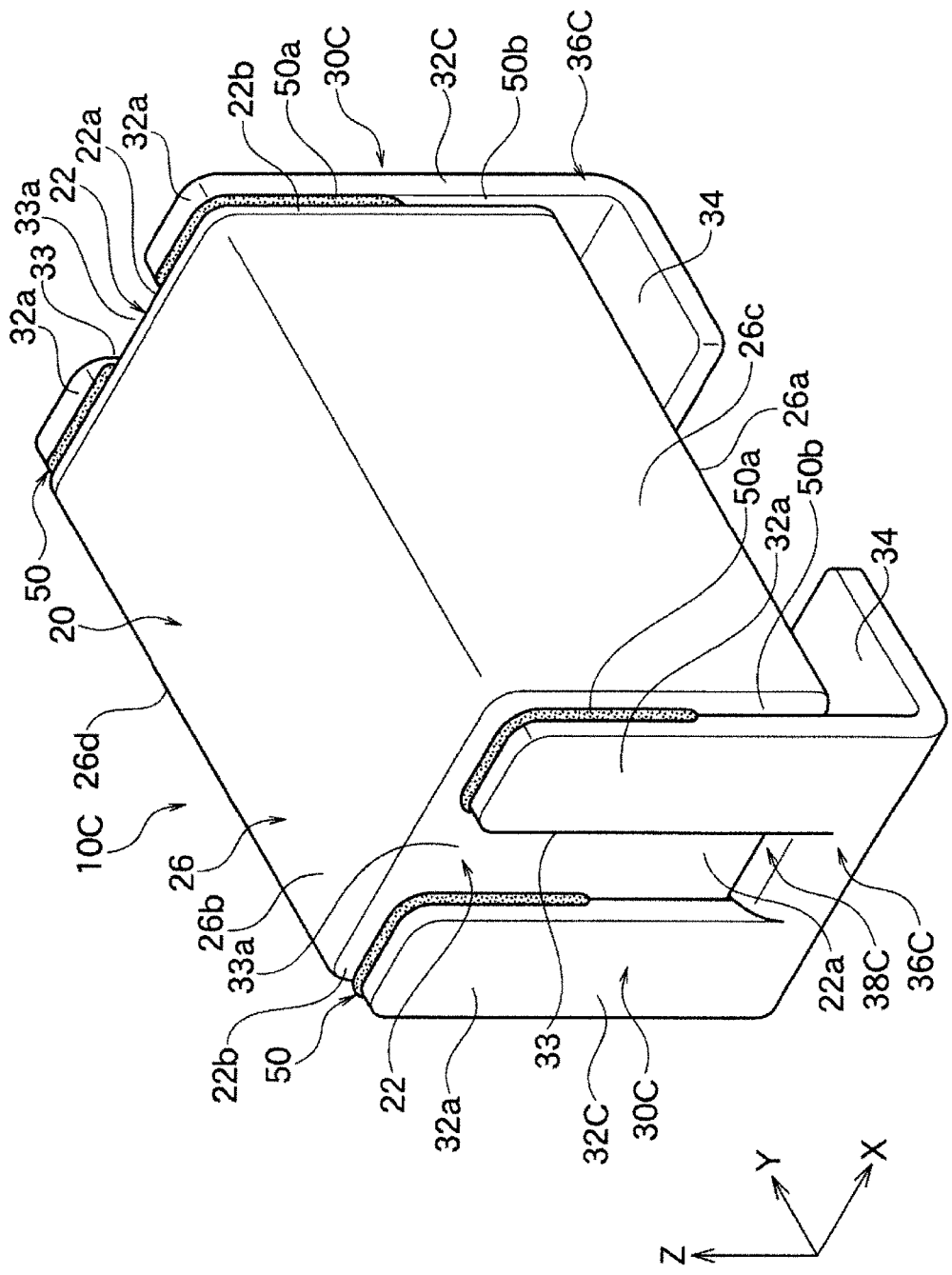
FIG. 14 is a perspective view of an electronic device according to still another embodiment of the present invention.

FIG. 14 is a perspective view of a ceramic capacitor 10C according to the fourth embodiment of the present invention. The ceramic capacitor 10C according to the present embodiment has the same structure and effect as the ceramic capacitor 10 according to the first embodiment shown in FIG. 1 to FIG. 11 other than the following. Thus, common member number is distributed to common parts, and the common parts will not be explained.

As shown in FIG. 14, the present embodiment has the same structure and effect as the ceramic capacitor 10 according to the first embodiment, except that metal terminals 30C are used instead of the metal terminals 30 according to the first embodiment mentioned above.

Figure 15:
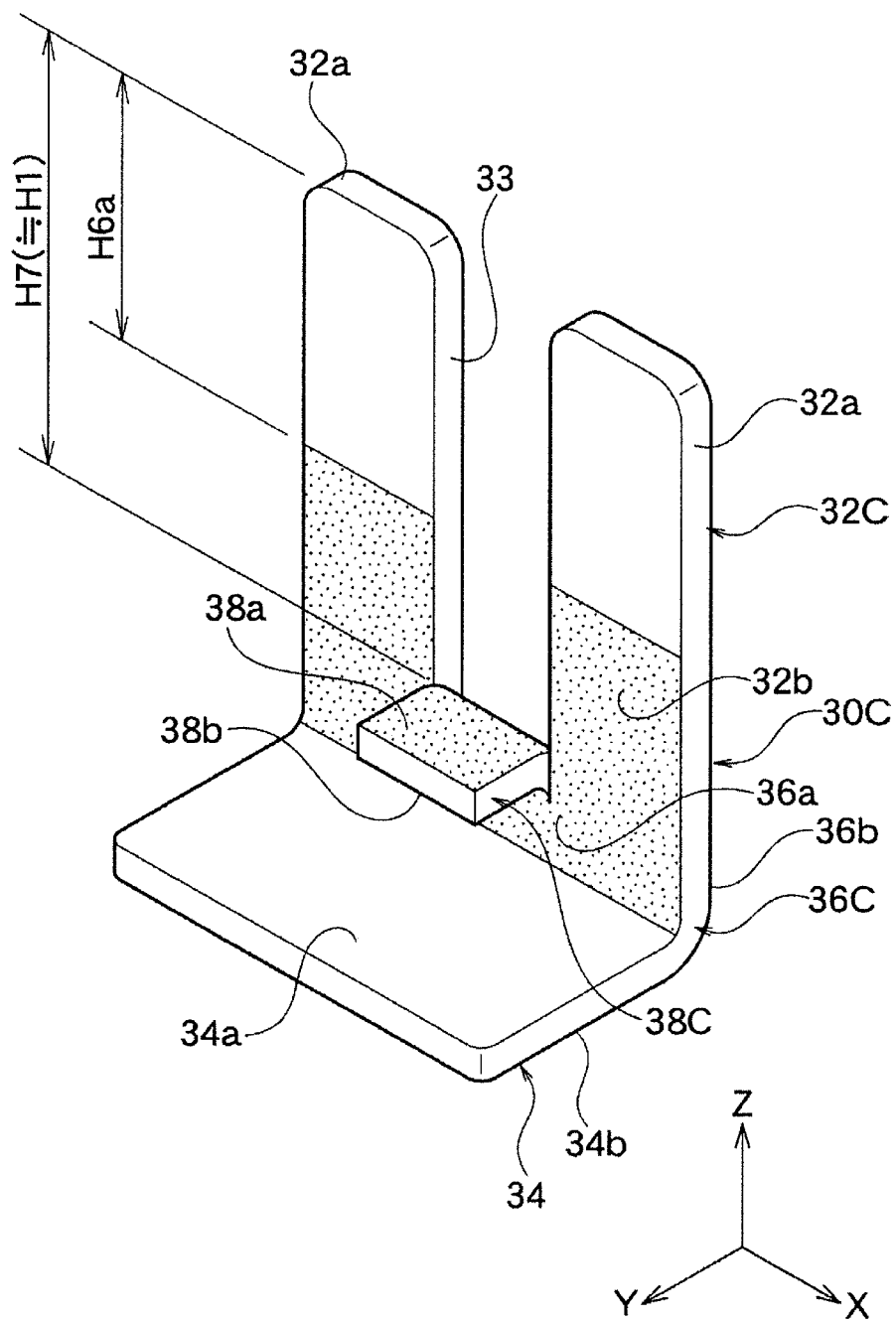
FIG. 15 is a perspective view of the external terminal shown in FIG. 14.

In the present embodiment, as shown in FIG. 15, a depth H1 of a groove 33 provided at the middle in the X-axis direction of an upper end in the Z-axis direction of a terminal electrode connection part 32C is substantially as long as a height H7 from the upper end in the Z-axis direction of the terminal electrode connection part 32C to an upper surface 38a of a support part 38C.

A pair of connection pieces 32a and 32a is formed at both sides in the X-axis direction of the groove 33, and a single support part 38C is provided on the bottom in the Z-axis direction of the groove 33. A support piece composing the support part 38C is folded from the groove 33 toward inside (at the side of a chip capacitor 20 shown in FIG. 14) and is formed integrally with a joint part 36C and the connection pieces 32a and 32a. The depth H1 of the groove 33 is preferably substantially as long as a Z-axis direction height H0 of an element body 26 shown in FIG. 4, and H1/H0 is preferably approximately 1.

In the present embodiment, as shown in FIG. 14, bonding regions 50a and non-bonding regions 50b are formed between the terminal electrode connection parts 32C of the metal terminals 30C and end surface electrode parts 22a of terminal electrodes 22, and the non-bonding regions 50b are formed from the terminal electrode connection parts 32C to the support parts 38C.

In the bonding regions 50a, a solder 50 mechanically and electrically joins the terminal electrode connection parts 32C of the metal terminals 30C and the end surface electrode parts 22a of the terminal electrodes 22. In the non-bonding regions 50b, there is no solder 50, and the terminal electrode connection parts 32C of the metal terminals 30C and the end surface electrode parts 22a of the terminal electrodes 22 are not joined by solder. The non-bonding regions 50b are continuously formed from the terminal electrode connection parts 32C to the support parts 38C.

Any method can be selected for forming the non-bonding regions 50b from the lower position (near the support parts 38C) of the terminal electrode connection parts 32C to the support parts 38C. For example, as shown in FIG. 15, at least a solder adhesion preventing region (a hatched region with dots in FIG. 15) may only be formed on the upper surface 38a of the support part 38C. The solder adhesion preventing region is formed not only on the upper surface 38a of the support part 38C, but on an opposing surface 32b located nearby to the end surface electrode part 22a of the terminal electrode connection part 32C. Further, the solder adhesion preventing region may be formed continuously to at least a part of an inner surface 36a of the joint part 36C.

Note that, no solder adhesion preventing region is preferably formed on a top surface 34a or a bottom surface 34b of a mounting connection part 34 shown in FIG. 15 so that the solder 52 shown in FIG. 11 is bonded to firmly connect the mounting connection part 34 on a mounting surface 62 of a circuit board 60. Also, no solder adhesion preventing region is preferably formed on an outer surface 36b of the joint part 36C shown in FIG. 15 so that the solder 52 shown in FIG. 11 is bonded to firmly connect the mounting connection part 34 on the mounting surface 62 of the circuit board 60. The solder 52 shown in FIG. 11 may not necessarily be bonded on the top surface 34a of the mounting connection part 34 or a lower surface 38b of the support part 38C, and thus the solder adhesion preventing region may be continuously formed thereon.

In the terminal electrode connection part 32 of the metal terminal 30 shown in FIG. 6 and FIG. 7A, a height H6a in the Z-axis direction with no solder adhesion preventing region is substantially the same as a height of the bonding regions 50a shown in FIG. 14, but may not be necessarily the same according to the amount of the solder 50.

Other Embodiment

Note that, the present invention is not limited to the above mentioned embodiments and can be variously modified within the scope thereof. For example, in the present invention, the grooves 33 formed on the terminal electrode connection parts 32 of the metal terminals 30 is not limited to have the shape of square with rounded bottom corners as shown in the illustrated embodiments, and may have shape of semi-circular, U-shaped, elliptic, reverse triangular, or other polygonal, for example.

In the above-mentioned embodiments, the bonding region 50a is formed using the solder 50, but may be formed by conductive adhesive.

EXAMPLES

Hereinafter, the present invention will be explained based on more detailed examples, but is not limited thereto.

Example 1

Ceramic capacitors 10 shown in FIG. 1 to FIG. 10 with W1/W0=0.5 were manufactured and mounted on mounting surfaces 62 of circuit boards 60 using a solder 52. H6/H7 was 0.56.

Figure 16:
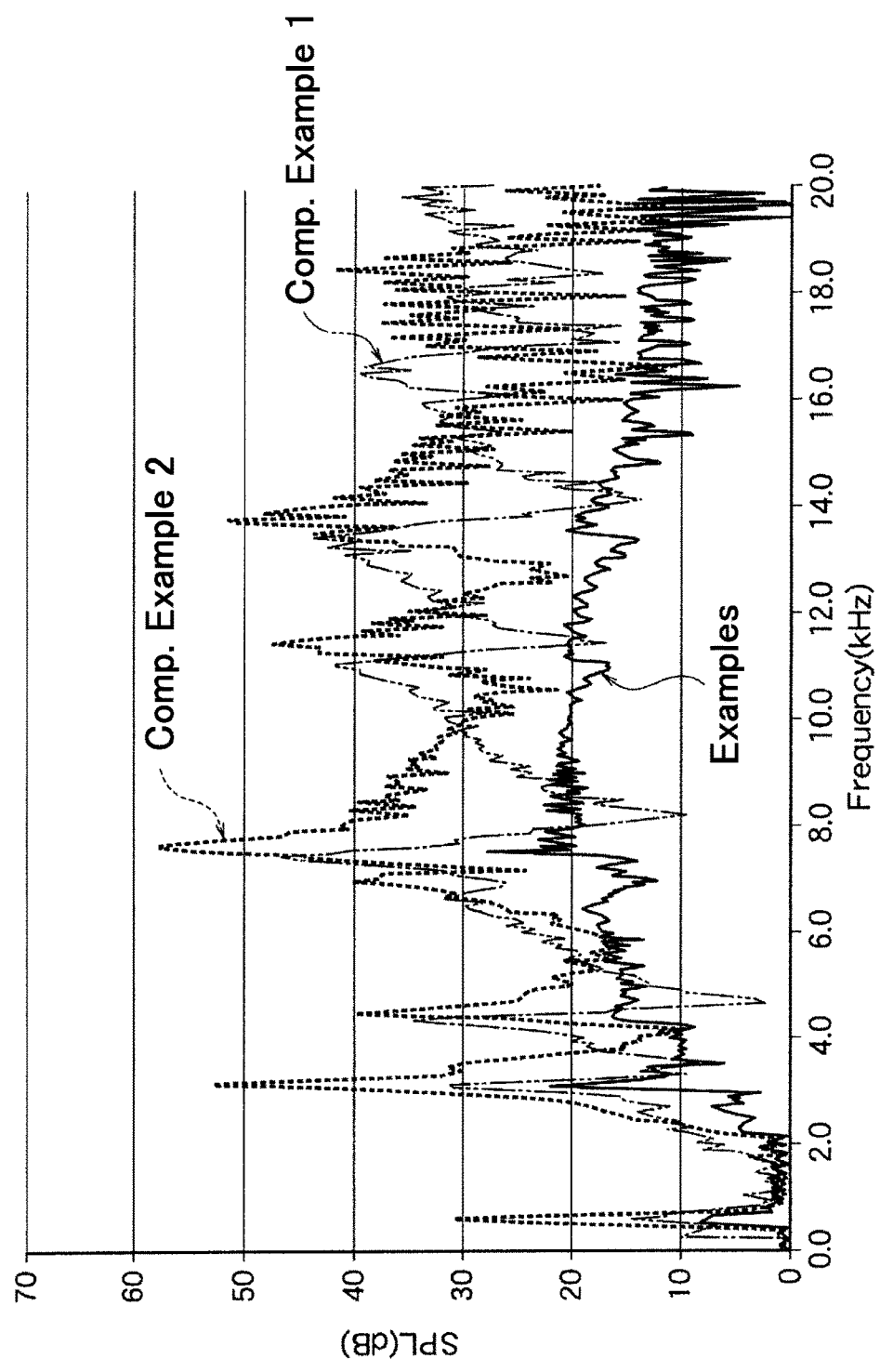
FIG. 16 is a graph showing comparison of acoustic noise of the electronic device between the example of the present invention and the comparative example.

In order to evaluate acoustic noise of the capacitors 10 in Example 1, a test for measuring sound pressure level was conducted by applying alternating current having frequency of 20 Hz to 20 kHz. The result is shown in FIG. 16. In FIG. 16, the vertical axis represents sound pressure level (SPL) showing acoustic noise, and the unit is dB. Also, the horizontal axis represents frequency of acoustic noise in the audible range.

Comparative Example 1

In order to evaluate acoustic noise, a test for measuring sound pressure level was conducted in the same way as Example 1 by applying alternating current having frequency of 20 Hz to 20 kHz, except that H6/H7 was 1, and that bonding regions 10a by soldering were also formed between support parts 38 and terminal electrodes 22. The result is shown in FIG. 16.

Comparative Example 2

Ceramic capacitors were manufactured in the same way as Example 1 except for W1/W0=1 and no support part 38, and a test was conducted in the same manner.
Evaluation As shown in FIG. 16, it was confirmed that the capacitors of Example 1 could prevent acoustic noise compared with the capacitors of Comparative Examples 1 and 2.

Example 2

Ceramic capacitors were manufactured in the same way as Example 1, except that H6/H7 was varied within a range of 0.3 to 0.9, and a test was conducted in the same manner. A result similar to that of Example 1 was obtained. Also, it was confirmed that joint strength was satisfactory as with that of Example 1.

NUMERICAL REFERENCES 10, 10A, 10B, 10C . . . ceramic capacitor
20, 20B . . . chip capacitor
22 . . . terminal electrode
22a . . . end surface electrode part
22b . . . side surface electrode part
26 . . . element body
26a . . . bottom surface
26b . . . top surface
20c . . . side surface
20d . . . side surface
30, 30A, 30C . . . metal terminal
32, 32A, 32C . . . terminal electrode connection part
32a . . . connection piece
33 . . . groove
34 . . . mounting connection part
36, 36C . . . joint part
38, 38C . . . support part
50, 52 . . . solder
50a . . . bonding region
50b . . . non-bonding region
60 . . . circuit board
62 . . . mounting surface

The invention claimed is:

1. An electronic device comprising:
a chip component having a terminal electrode formed on an end surface of an element body; and
an external terminal electrically connected to the terminal electrode, wherein the external terminal comprises:
a terminal electrode connection part arranged to face an end surface electrode part of the terminal electrode;
a mounting connection part connectable to a mounting surface; and
a support part facing one side surface of the element body closest to the mounting surface so as to support the one side surface spaced from the mounting surface, and wherein
a bonding region and a non-bonding region are formed between the terminal electrode connection part of the external terminal and the end surface electrode part of the terminal electrode,
the non-bonding region is formed from the terminal electrode connection part to the support part, and
the bonding region is formed in a range of a predetermined height from an upper end of the terminal electrode connection part.

2. The electronic device as set forth in claim 1, wherein the non-bonding region includes a clearance between the external terminal and the terminal electrode.

3. The electronic device as set forth in claim 2, wherein
a joint part connects the terminal electrode connection part and the mounting connection part, and
the support part protrudes to the one side surface of the element body at a boundary position between the terminal electrode connection part and the joint part and is integrally formed with the terminal electrode connection part.

4. The electronic device as set forth in claim 3, wherein
the joint part and the support part are dislocated along a width direction of the terminal electrode connection part,
the support part is comprised of a pair of support parts protruding from both sides along the width direction of the terminal electrode connection part toward the one side surface of the element body, and
the mounting connection part and the support part are formed not to overlap each other seen from a direction vertical to the mounting surface at a vicinity of the end surface of the element body.

5. The electronic device as set forth in claim 4, wherein a width (W1) of the joint part along a direction parallel to the mounting surface is smaller than a width (W0) of the terminal electrode connection part.

6. The electronic device as set forth in claim 5, wherein a ratio (W1/W0) of the width (W1) of the joint part to the width (W0) of the terminal electrode connection part is 0.3 to 0.8.

7. The electronic device as set forth in claim 3, wherein a width (W1) of the joint part along a direction parallel to the mounting surface is smaller than a width (W0) of the terminal electrode connection part.

8. The electronic device as set forth in claim 7, wherein a ratio (W1/W0) of the width (W1) of the joint part to the width (W0) of the terminal electrode connection part is 0.3 to 0.8.

9. The electronic device as set forth in claim 1, wherein a joint part connects the terminal electrode connection part and the mounting connection part, and
the support part protrudes to the one side surface of the element body at a boundary position between the terminal electrode connection part and the joint part and is integrally formed with the terminal electrode connection part.

10. The electronic device as set forth in claim 9, wherein the joint part and the support part are dislocated along a width direction of the terminal electrode connection part,
the support part is comprised of a pair of support parts protruding from both sides along the width direction of the terminal electrode connection part toward the one side surface of the element body, and
the mounting connection part and the support part are formed not to overlap each other seen from a direction vertical to the mounting surface at a vicinity of the end surface of the element body.

11. The electronic device as set forth in claim 10, wherein a width (W1) of the joint part along a direction parallel to the mounting surface is smaller than a width (W0) of the terminal electrode connection part.

12. The electronic device as set forth in claim 11, wherein a ratio (W1/W0) of the width (W1) of the joint part to the width (W0) of the terminal electrode connection part is 0.3 to 0.8.

13. The electronic device as set forth in claim 9, wherein a width (W1) of the joint part along a direction parallel to the mounting surface is smaller than a width (W0) of the terminal electrode connection part.

14. The electronic device as set forth in claim 13, wherein a ratio (W1/W0) of the width (W1) of the joint part to the width (W0) of the terminal electrode connection part is 0.3 to 0.8.

15. The electronic device as set forth in claim 1, wherein a treatment for preventing solder adhesion is performed to a surface of the external terminal facing the terminal electrode in the non-bonding region.

16. An electronic device comprising:
a chip component having a terminal electrode formed on an end surface of an element body; and
an external terminal electrically connected to the terminal electrode, wherein the external terminal comprises:
a terminal electrode connection part arranged to face an end surface electrode part of the terminal electrode;
a mounting connection part connectable to a mounting surface; and
a support part facing one side surface of the element body closest to the mounting surface so as to support the one side surface spaced from the mounting surface, and wherein
a bonding region and a non-bonding region are formed between the terminal electrode connection part of the external terminal and the end surface electrode part of the terminal electrode,
the non-bonding region is formed from the terminal electrode connection part to the support part, and
a facing surface of the support part opposing to the bottom surface of the element body is the same side surface with an inner surface of the terminal electrode connection part.

17. An electronic device comprising:
a chip component having a terminal electrode formed on an end surface of an element body; and
an external terminal electrically connected to the terminal electrode, wherein the external terminal comprises:
a terminal electrode connection part arranged to face an end surface electrode part of the terminal electrode;
a mounting connection part connectable to a mounting surface; and
a support part facing one side surface of the element body closest to the mounting surface so as to support the one side surface spaced from the mounting surface, and wherein
a bonding region and a non-bonding region are formed between the terminal electrode connection part of the external terminal and the end surface electrode part of the terminal electrode,
the non-bonding region is formed from the terminal electrode connection part to the support part,
a groove which does not cover a part of an end surface of the element body is formed on the terminal electrode connection part, and
the groove is open toward a top surface of the element body located at an opposite side of the mounting surface.

* * * * *